US006548867B2

(12) United States Patent
Yamada et al.

(10) Patent No.: US 6,548,867 B2
(45) Date of Patent: Apr. 15, 2003

(54) SEMICONDUCTOR DEVICE HAVING THIN FILM TRANSISTOR FOR SUPPLYING CURRENT TO DRIVEN ELEMENT

(75) Inventors: Tsutomu Yamada, Gifu (JP); Katsuya Anzai, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/233,976

(22) Filed: Sep. 3, 2002

(65) Prior Publication Data

US 2003/0001157 A1 Jan. 2, 2003

Related U.S. Application Data

(63) Continuation of application No. 09/966,018, filed on Sep. 28, 2001, now Pat. No. 6,469,318.

(30) Foreign Application Priority Data

Sep. 20, 2000 (JP) ........................................ 2000-299669
Sep. 14, 2001 (JP) ........................................ 2001-279748

(51) Int. Cl.$^7$ ........................... H01L 27/01; H01L 27/12; H01L 31/0392
(52) U.S. Cl. .............................. 257/350; 257/59; 257/72
(58) Field of Search ............................. 257/59, 72, 350

(56) References Cited

U.S. PATENT DOCUMENTS 6,051,453 A    4/2000  Takemura
6,268,631 B1   7/2001  Fukada et al.
6,462,806 B2 * 10/2002 Zhang et al. ................ 349/199

* cited by examiner

Primary Examiner—Ngân V. Ngô
(74) Attorney, Agent, or Firm—Cantor Colburn LLP (57) ABSTRACT

Thin film transistors TFT2*a* and TFT2*b* for driving elements are formed in parallel between a power source line and an organic EL element, and active layers of the transistors TFT2*a* and TFT2*b* are spaced apart in a scanning direction of a laser used for annealing for polycrystallization. As a result, the annealing conditions for the transistors TFT2*a* and TFT2*b* will not be exactly the same, thereby reducing the chance of a same problem being caused in both transistors TFT2*a* and TFT2*b*.

12 Claims, 7 Drawing Sheets

SEMICONDUCTOR DEVICE HAVING THIN FILM TRANSISTOR FOR SUPPLYING CURRENT TO DRIVEN ELEMENT

CROSS-REFERENCE TO RELATED APPLICATIONS

This application is a continuation application of U.S. patent application Ser. No. 09/966,018, filed on Sep. 28, 2001, now U.S. Pat. No. 6,469,318 filed Oct. 22, 2002, which is herein incorporated by reference in its entirety.

BACKGROUND OF THE INVENTION

Organic electroluminescence (hereinafter referred to as "EL") display panels using organic EL elements have been known as flat panel displays. While liquid crystal displays (LCDs) are widely used as flat panel displays, LCDs merely transmit or reflect light from a light source separately provided, and are not self-emissive. On the other hand, organic EL display elements are used in a self-emissive display for supplying a current to an organic EL layer provided between an anode and a cathode to cause the layer to emit light, and therefore back lighting is not required, as opposed to the LCDS. Organic EL display devices are expected to become the next mainstream flat display panel for that reason and because they are thin, compact, bright, and low power consumption devices. Particularly, it is expected that an active matrix organic EL displays including a switching element for each pixel will become mainstream devices among next-generation flat panel display devices because each pixel thereof can be independently turned on and the amount of current can be decreased, making it possible to maintain a high display quality when used for high resolution large screens.

In such an active matrix organic EL display, a thin film transistor provided for switching for each of the organic EL elements (light emissive elements) arranged in a matrix individually controls supply of current from a power source to the organic EL element, and causes the element to emit light at a luminance in accordance with a data signal.

Known thin film transistors used as a switching element for each pixel include a semiconductor layer of amorphous silicon, polysilicon, or the like, which forms an active layer. Although for simplicity in manufacturing amorphous silicon has been used for the active layer of the thin film transistor, polycrystalline silicon has come to be used in order to enhance operation speed and implement a display device with a high resolution. To form a polysilicon layer on a substrate having a low melting point, a laser annealing process is first performed on a silicon film formed in the amorphous state, thereby polycrystallizing the amorphous silicon.

Such a laser annealing process is usually performed by sequentially scanning the irradiated object with a pulsed laser beam (sheet beam) shaped such that the irradiated area will be an elongated rectangle. However, as the laser irradiating conditions are varied and not always the same, resulting variation in crystal properties of the thin film transistors leads to a difference in properties among the thin film transistors located at different positions on the same substrate, resulting in variations in pixel luminance.

SUMMARY OF INVENTION

A semiconductor device having on a substrate a plurality of thin film transistors using a semiconductor layer annealed with a line pulsed laser as a channel region, includes: at least one element driving thin film transistor for supplying a driving current from a power source line to a corresponding driven element; and a switching thin film transistor for controlling the element driving thin film transistor based on a data signal supplied when selected; wherein the element driving thin film transistor is disposed such that a longitudinal direction of an area irradiated with the line pulsed laser traverses the element driving thin film transistor in a channel width direction thereof.

DESCRIPTION OF PREFERRED EMBODIMENTS

Preferred embodiments of the present invention will now be described with reference to the accompanying drawings.

[First Embodiment]

Figure 1:
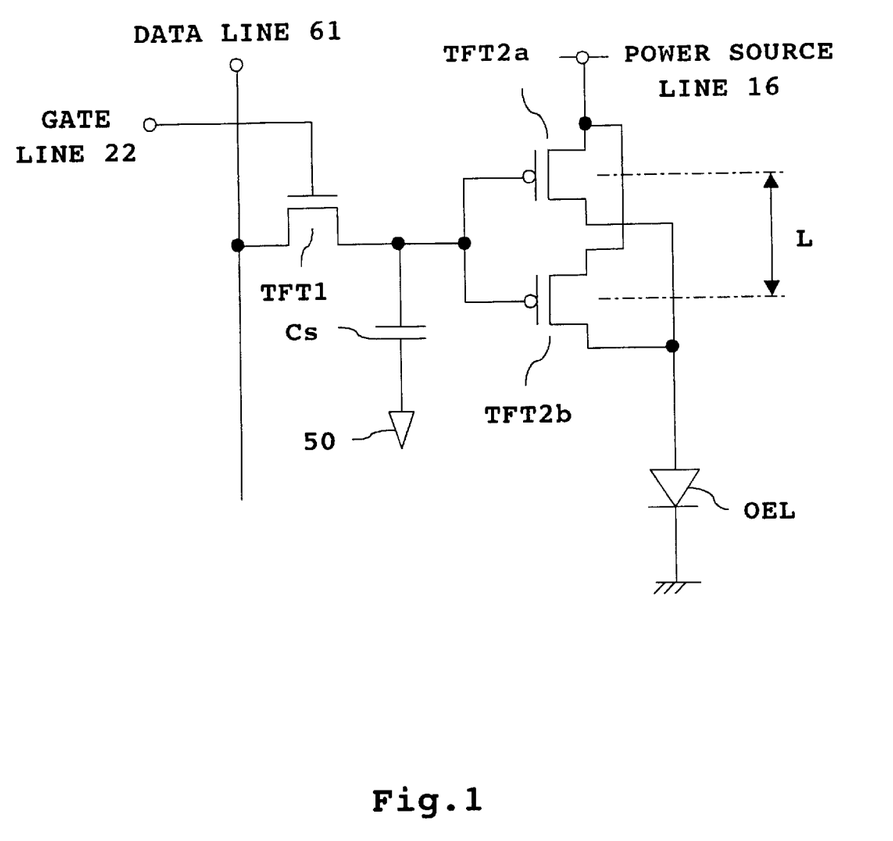
FIG. 1 illustrates a circuit configuration of a pixel of an organic EL display device according to a first embodiment of the present invention.

FIG. 1 shows a circuit configuration for each pixel of an organic EL display panel of an active matrix type. For a single pixel, an organic EL element OEL, a thin film transistor TFT1 for switching, TFTs for driving elements (TFT2$a$ and TFT2$b$), and a storage capacitor Cs are provided. The N-channel thin film transistor TFT1 has a gate connected to a gate line (selection line) 22, a drain connected to a data line 61, and a source connected to gates of the two P-channel thin film transistors TFT2$a$ and TFT2$b$ connected in parallel. The thin film transistors TFT2$a$ and TFT2$b$ each have a source connected to a power source line 16, and a drain connected in common to the organic EL element OEL whose other end is connected to a constant potential (Vcom). The gates of the thin film transistors TFT2$a$ and TFT2$b$ are connected to the storage capacitor Cs whose other end is connected to a power source 50.

When a signal at a level sufficient to turn on the N-channel TFT1 is applied to the gate line 22 as a selection signal, the thin film transistor TFT1 is turned on, and the thin film transistors TFT2$a$ and TFT2$b$ are operated in accordance with a voltage value of a data signal applied to the data line 61 at that moment. Because the thin film transistors TFT2$a$ and TFT2$b$ are formed as the P-channel TFTs, these P-channel transistors are turned on when the data signal is at a level sufficient to turn on the transistors TFT2$a$ and TFT2$b$ (predetermined L level) and, in accordance with this L level, a current is supplied from the power source line 16 to the organic EL element OEL, whereby the organic EL element OEL emits light. Further, because the capacitor Cs is provided, the gate voltage of the thin film transistors TFT2$a$ and TFT2$b$ is maintained at the data signal voltage for a predetermined time after the thin film transistor TFT1 is turned off. In accordance with this voltage, the thin film transistors TFT2a and TFT2b are continuously in the ON state, so that the organic EL element OEL continues light emission.

A plurality of pixels, each having the above-described configuration, are arranged in a matrix in a display area of a display device. An H level selection signal is sequentially supplied to the gate line 22 extending in the row direction of pixels arranged in the matrix as described above, thereby sequentially selecting the corresponding line and turning on the thin film transistor TFT1. At the same time, display data for a pixel at the corresponding coordinates is supplied to the data line 61 extending in a column direction of the pixels arranged in the matrix, so that the organic EL element OEL for the corresponding pixel can emit light at the luminance in accordance with the display data.

The voltage of the data signal supplied to the data line 61 is adjusted in accordance with the luminance to be displayed, and is applied to the gates of the thin film transistors TFT2a and TFT2b through the thin film transistor TFT1. Consequently, the amount of current supplied from the power source line 16 to the organic EL element OEL for that pixel is adjusted, thereby adjusting the luminance of light emitted from the organic EL element OEL and displaying images with a desired tone.

In the present embodiment, two thin film transistors TFT2a and TFT2b are provided as the thin film transistors for supplying a driving current from the power source line 16 to the organic EL element OEL. Provision of such a plurality of thin film transistors (TFT2a and TFT2b) connected in parallel enables supply of a sufficient driving current to the organic EL element OEL.

Further, a distance L between the channels of the two thin film transistors TFT2a and TFT2b is determined corresponding to a movement pitch of the laser during laser annealing. More specifically, the distance L is set larger than the movement pitch P during laser annealing (L>P).

Figure 2:
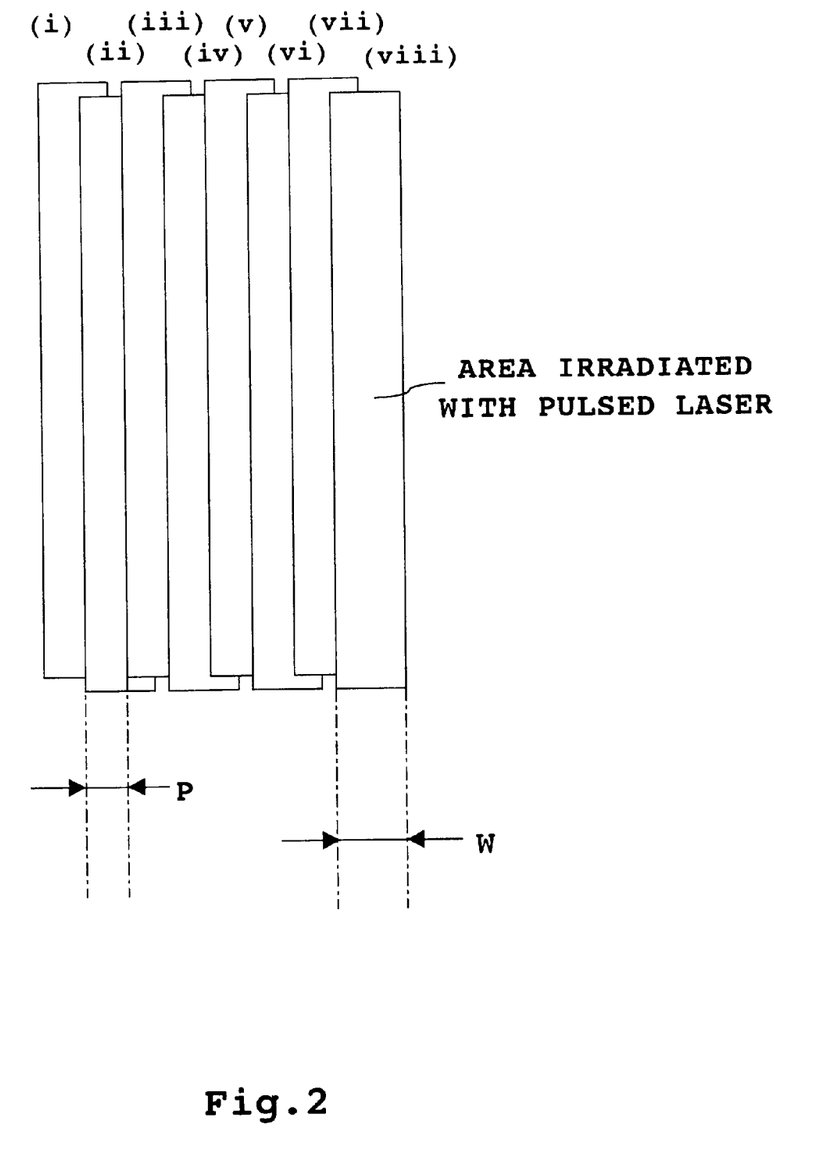
FIG. 2 illustrates an irradiation pitch of a laser.

FIG. 2 shows the movement pitch during laser annealing. For this laser annealing process, an excimer laser or the like is used, and the laser beam therefrom is shaped as an elongated rectangle having a width W. The laser is a pulsed laser, and moved in the width direction of the rectangle by the pitch P after each irradiation. The pitch P is smaller than the width W, being half the width W in this particular example. Basically the semiconductor layer is irradiated twice by the pulsed laser. It should be noted that, while the laser irradiation areas are illustrated in the figure as being shifted in the vertical direction for clarity of illustration, in actual operation the laser is not shifted in the vertical direction, but only scans in the horizontal direction. In the example shown in FIG. 2, scanning is performed from the left, i.e. from (i) to (viii). When the width W is 600 m and the pitch P is 30 m, the area having the width W is irradiated 20 times by the laser and the ratio of the pitch to the width is 1/20 in contrast to 1/2 in the above example.

Although desirably a constant energy of the laser is maintained throughout irradiation, variation cannot be eliminated at present.

Therefore, the irradiated energy may differ among different irradiation areas as the laser moves by the pitch P. However, because in the present embodiment the two thin film transistors TFT2a and TFT2b are spaced apart by a distance longer than the pitch P, it is possible to prevent the channels of both transistors TFT2a and TFT2b from being annealed by the same $n^{th}$ shot. As a result, it is possible to effectively prevent the characteristics of the two thin film transistors TFT2a and TFT2b from varying in the same manner and the combined characteristics of these transistors TFT2a and TFT2b from greatly differing from those of the transistors TFT2a and TFT2b for pixels at other locations.

While the distance L exceeds the pitch P in the first embodiment, maintaining such a relationship is not always necessary. As long as the channels of the thin film transistors TFT2a and TFT2b are displaced from each other in the direction parallel to the laser scanning direction, the possibility of simultaneously irradiating both thin film transistors TFT2a and TFT2b with a particular laser shot having deviated characteristics can be reduced. Alternatively, a layout in which these two TFTs are disposed such that the channels thereof do not run in parallel to each other may be employed in the first embodiment to displace the TFTs from each other in the directions parallel and perpendicular to the laser scanning direction. Such a layout can reduce the possibility of varying the characteristics of the thin film transistors TFT2a and TFT2b in the same manner.

Figure 3A:
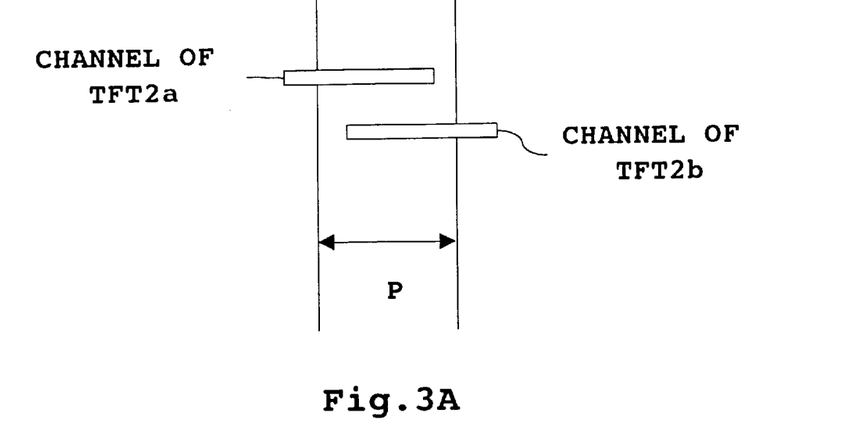
FIGS. 3A, 3B, and 3C show arrangements of channels of thin film transistors (TFTs).
Figure 3B:
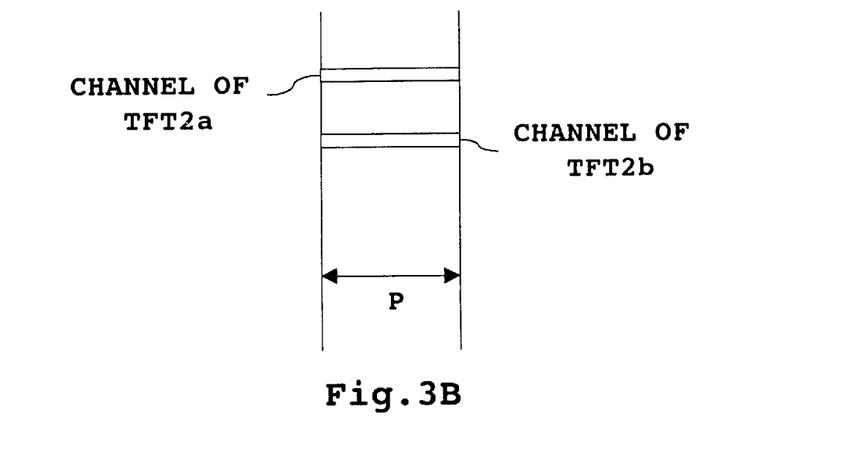
Figure 3C:
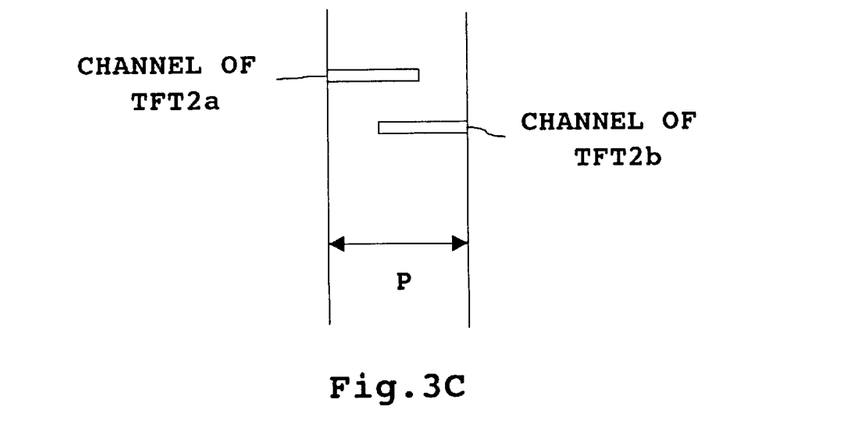

FIG. 3A, FIG. 3B, and FIG. 3C illustrate examples of the relationship between the laser movement pitch (scanning pitch) P and the positions of the channels of the thin film transistors TFT2a and TFT2b. When the channels of the thin film transistors TFT2a and TFT2b are arranged at exactly the same position with respect to the laser scanning direction as illustrated in FIG. 3B, both of the thin film transistors TFT2a and TFT2b will have substantially the same characteristics. On the other hand, a slight displacement as illustrated in FIG. 3A and FIG. 3C can produce a difference in characteristics of these two transistors, thereby reducing variation in the amount of light emitted from the organic EL element OEL. The arrangement in which both of the transistors TFT2a and TFT2b are not completely covered by a single shot as shown in FIG. 3A is effective when the laser energy varies between shots, while the arrangement shown in FIGS. 3A and 3C is effective when the laser energy varies within a single shot.

Figure 4:
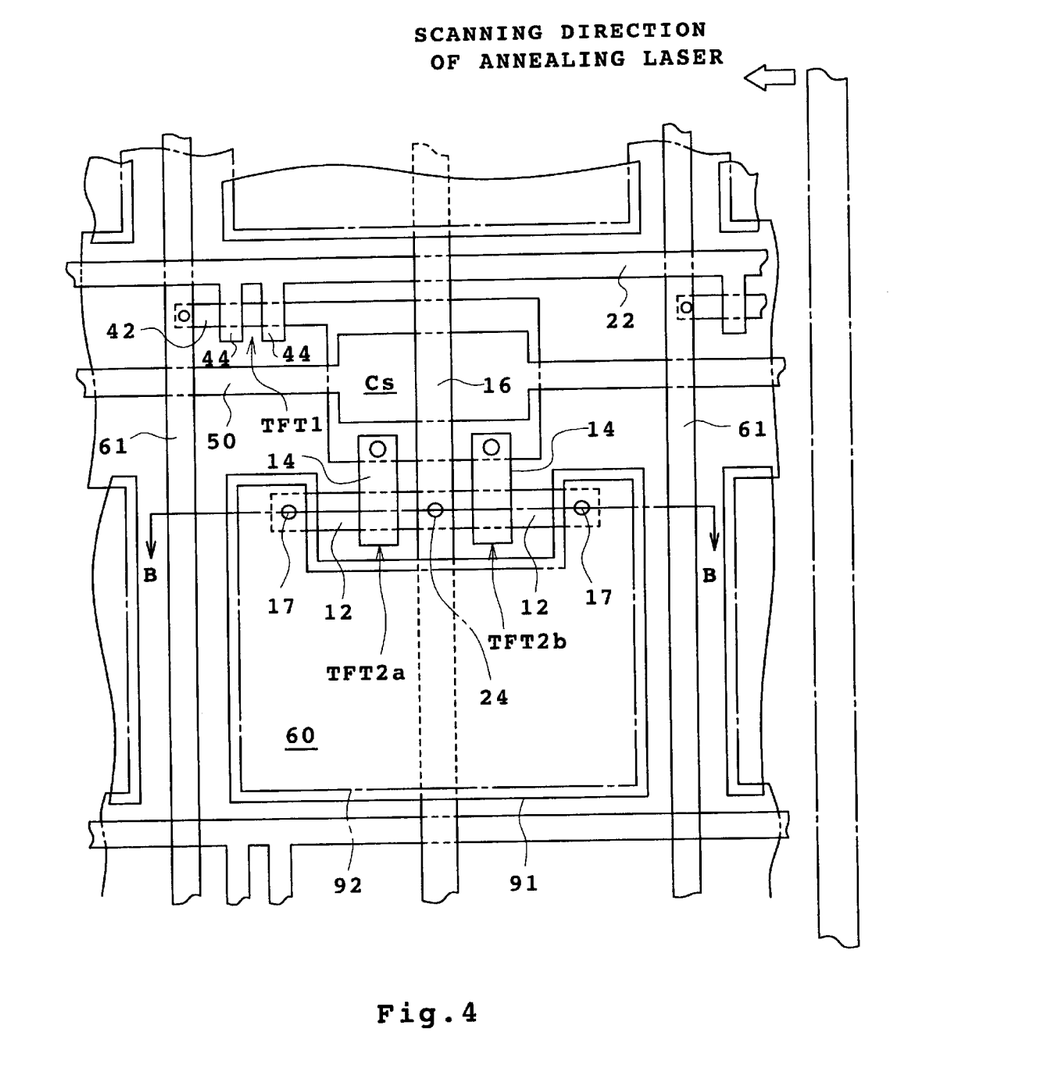
FIG. 4 illustrates a planar configuration of the organic EL display device according to the first embodiment of the present invention.
Figure 5:
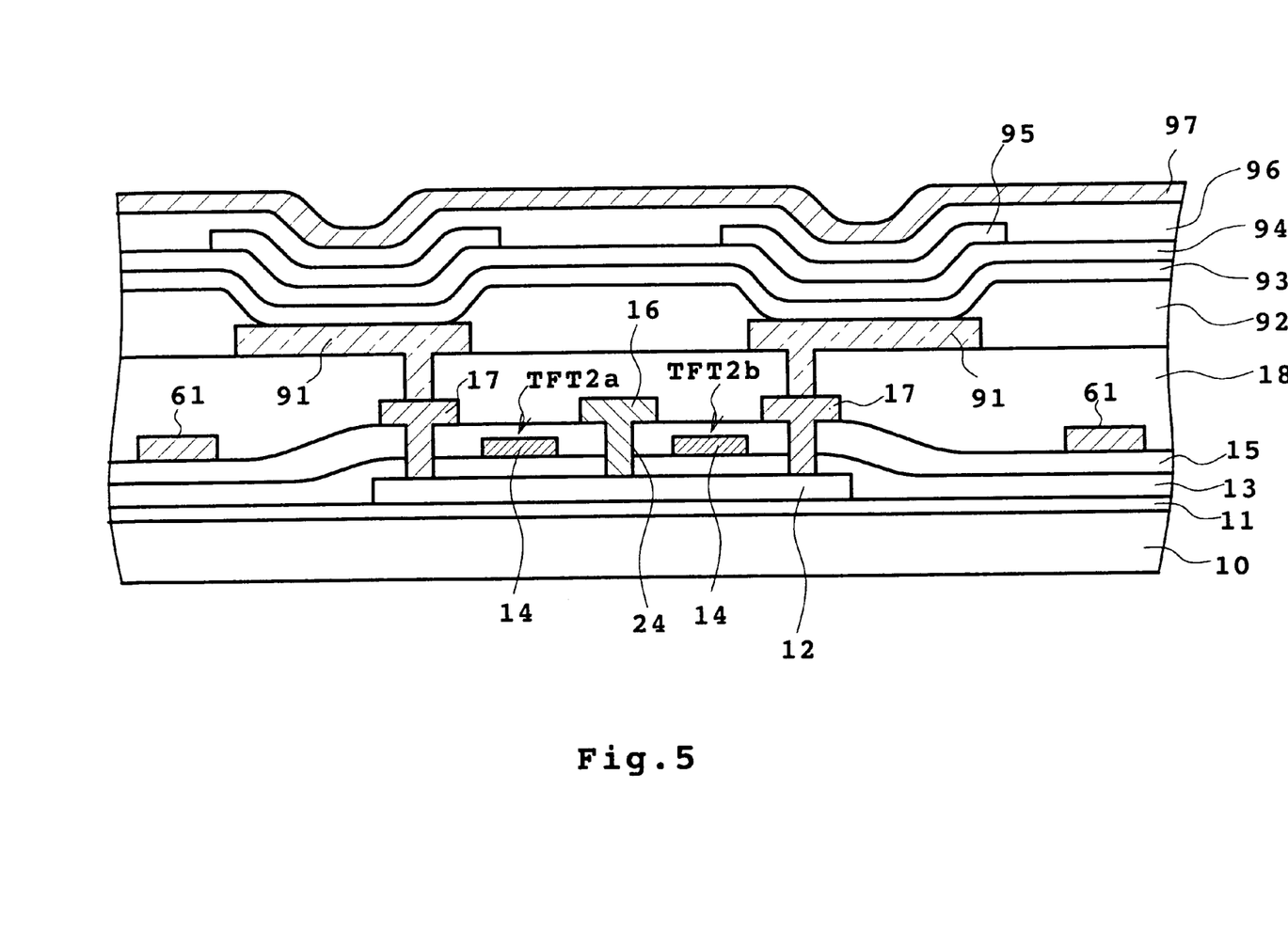
FIG. 5 is a cross sectional view taken along the line B—B in FIG. 4.

FIG. 4 shows an example of a planar configuration of an organic EL display device having a circuit configuration illustrated in FIG. 1, and FIG. 5 shows a cross sectional view taken along the line B—B.

Referring to FIG. 4, a single pixel region is defined by the gate line 22 extending in a row direction and the data line 61 in the column direction, and in this region the thin film transistor TFT1, the storage capacitor Cs, the two P-channel thin film transistors TFT2a and TFT2b, and an organic EL element 60 connected to the drains of the transistors TFT2a and TFT2b through a drain electrode 17 are disposed. The power source line 16 is disposed in a central portion sandwiched between the two data lines 61 and penetrating the central portion of each pixel region in the vertical direction.

For each pixel region, the thin film a transistor TFT1 is formed near an intersection between the gate line 22 and the data line 61. The thin film transistor TFT1 includes an active layer 42 formed of p-Si obtained by polycrystallizing a-Si through a laser annealing process, and underlying, at two portions thereof, the gate electrode 44 protruding from the gate line 22. Thus, the transistor is of a double gate structure.

The P-channel thin film transistors TFT2a and TFT2b use a semiconductor layer 12 as their active layer. The semiconductor layer 12 is formed in the pattern of an island crossing under the power source line 16 and extending on either side of the line 16. Referring to FIG. 5, impurities are doped to the opposing ends of the semiconductor layer 12 to form drain regions of the transistors TFT2a and TFT2b, and to portions stretching from the power source line 16 on both sides thereof to form source regions, which are connected to the power source line 16 through a source electrode 24.

The respective regions of the semiconductor layer 12 located under the gate electrodes 14 and sandwiched between the source and drain regions act as channel regions of the thin film transistors TFT2a and TFT2b. The distance between the channels (the distance between the gate electrodes 14) corresponds to the above-described distance L, which is set longer than the scanning pitch P during the laser annealing process.

It should be noted that, because the semiconductor layer 12 is simultaneously formed with the active layer 42 of the thin film transistor TFT1, polycrystalline silicon formed by polycrystallizing a-Si through the laser annealing process described above is used for this layer.

Each gate electrode 14 of the thin film transistors TFT2a and TFT2b is a conductive layer simultaneously formed with, and of the same material as, the gate line 22, and extending along the power source line 16. Each of the gate electrodes 14 is connected to one electrode of the storage capacitor Cs, and this electrode is integrally formed with the active layer 42 of the thin film transistor TFT1. The other electrode of the storage capacitor Cs is integrally formed with an SC line 50.

After the thin film transistors TFT1, TFT2a, and TFT2b are formed as described above, a planarization insulating layer 18 is formed over the entire surface of the substrate for the purpose of planarizing the upper surface.

On this planarization insulating film 18, the organic EL element 60 is formed including an anode (transparent electrode) 91, a cathode (metal electrode) 97 provided as the uppermost layer shared by all pixels, and organic layers stacked between them. The anodes 91 are connected to each other through the drain regions of the thin film transistors TFT2a and TFT2b and the drain electrode 17. The organic layers include, for example, a first hole transport layer 93, a second hole transport layer 94, an organic light emissive layer 95, and an electron transport layer 96, stacked in this order from the anode side. By way of example, the first hole transport layer 93 includes MTDATA: 4,4',4"-tris(3-methylphenylphenylamino)triphenylamine, the second hole transport layer 94 includes TPD: N,N'-diphenyl-N,N'-di(3-methylphenyl)-1,1'-biphenyl-4,4'-diamine, the organic light emissive layer 95 includes, for example, $BeBq_2$: bis(10-hydroxybenzo[h]quinolinato)beryllium) containing quinacridone derivatives, though the material depends on the intended color of light emitted, i.e. R, G, or B, and the electron transport layer 96 includes $BeBq_2$. Except for the anode 91 formed of ITO (indium tin oxide) or the like and the organic emissive layer 95, the respective layers (93, 94, 96, and 97) of the organic EL element 60 are shared by all pixels. It should be noted that the configuration of the element 60 is not limited to the example described above.

The above-described elements are all stacked on the substrate 10 to form a multi-layered structure. More specifically, on the substrate 10 an insulating layer 11 of $SiO_2$ and SiN is formed, and is topped by the semiconductor layer 12 formed in the above-described pattern, as illustrated in FIG. 5. The gate electrode 14 of Cr is then formed in a predetermined pattern on the semiconductor layer 12 with a gate instulating film 13 interposed between them, and is covered with a multi-layered interlayer insulating film 15 formed of $SiO_2$ and SiN. The drain electrode 17 connected to the drain region of the semiconductor layer 12 through a contact hole is next formed of Al, and the source electrode 24, the power source line 16, and the data line 61 are also formed. These elements are covered with the planarization insulating layer 18 formed of a photosensitive resin, and on this layer the organic EL element 60 of the above-described configuration is formed.

In the present embodiment, the active layers 42 and 12 are formed of a polycrystalline silicon layer polycrystallized through a laser annealing process, which is performed by scanning the layer in the row direction with a laser beam elongated in the column direction of FIG. 4. Because the thin film transistors TFT2a and TFT2b are spaced apart, i.e. the distance L between the channels exceeds the laser pitch P, the thin film transistors TFT2a and TFT2b can be prevented from simultaneously causing a problem by laser annealing.

Further, as shown in FIG. 4, the power source line 16 is disposed penetrating the central portion of the pixels with respect to the horizontal direction, and the thin film transistors TFT2a and TFT2b are disposed on opposing sides of the line 16. As a result, provision of a wide separation between the thin film transistors TFT2a and TFT2b will not particularly affect other factors, such as aperture ratio (light emissive area), and an effective layout can be achieved.

[Second Embodiment]

Next, another exemplary pixel configuration will be described as a second embodiment of the present invention with reference to FIG. 6. The elements corresponding to those described above are labeled with the same numerals and characters. Mainly the layouts of the transistors TFT1 and TFT2, the storage capacitor Cs, and the organic EL element 60 for each pixel differ from those in the first embodiment, and the cross sectional structures of the respective circuit elements are the same as those described above and as shown in FIG. 5.

Figure 6:
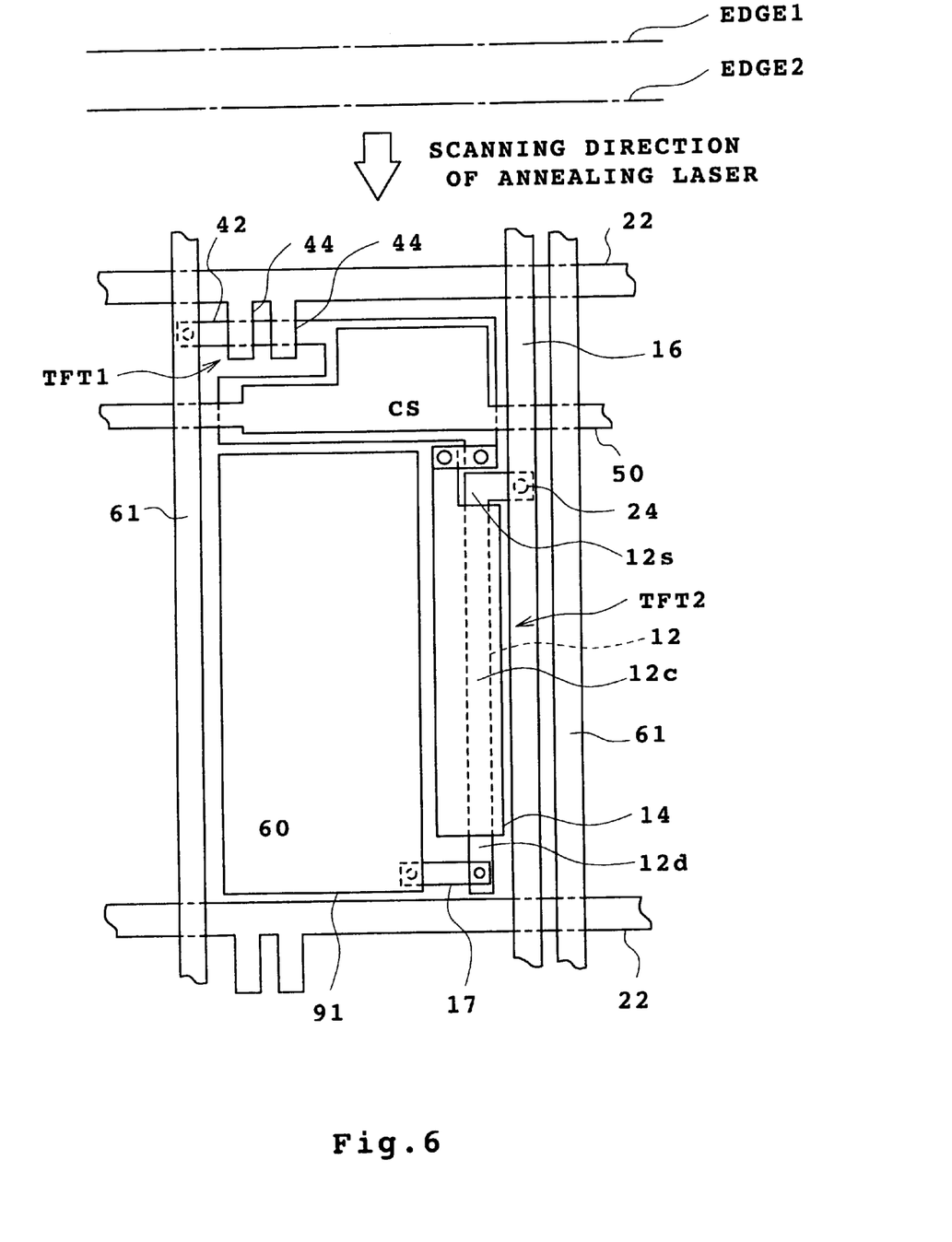
FIG. 6 illustrates a planar configuration of an organic EL display device according to a second embodiment of the present invention.

In the example of FIG. 6, the laser used for annealing is set to scan in the column direction of the figure (the direction in which the data line 61 extends), and the thin film transistor TFT2 supplying an electric current from the power source line 16 to the organic EL element 60 for driving is disposed such that the channel (12c) length direction runs substantially parallel to the scanning direction of the annealing laser, or that the longitudinal edge of the area irradiated with the pulsed laser traverses the channel 12c in the width direction. On the other hand, the switching thin film transistor TFT1 is formed such that the channel length direction there of extends in the row direction, i.e. the direction the gate line 22 extends, as in the first embodiment. Therefore, in the configuration of the second embodiment, the channel length directions of the switching thin film transistor TFT1 and the element driving thin film transistor TFT2 are arranged to differ from each other.

The active layer (semiconductor layer) 12 of the element driving transistor TFT2 is formed of polysilicon obtained by polycrystallizing amorphous silicon through laser annealing, similarly to the transistors TFT2a and TFT2b in the first embodiment. The active layer 12 is patterned along the direction in which the data line 61 extends, as illustrated in FIG. 6. Further, in the example of FIG. 6, the active layer 12 is electrically connected to the power source line 16 near the storage capacitor Cs, and to the ITO electrode (anode) 91 of the organic EL element 60 near the gate line 22 for the next row of the matrix.

The gate electrode 14 of the transistor TFT2 is connected to one electrode of the storage capacitor Cs integral with the active layer 42 of the switching thin film transistor TFT1, and is patterned to extend in the column direction from the portion connected to the capacitor Cs, thereby extensively covering the active layer 12. The active layer 12 includes the channel region 12c whose upper layer is covered with the gate electrode 14, and a source region 12s (on, for example, the power source line 16 side) and a drain region 12d (on, for example, the anode 91 side) on opposing sides of the channel region 12c.

Because a high withstanding voltage is desired for the element driving thin film transistor TFT2 required to supply a relatively large amount of current to the organic EL element 60, it is very likely that the channel length CL will be designed longer than the channel width and longer than the channel length of the switching thin film transistor TFT1.

Accordingly, arrangement of this transistor TFT2 such that the channel length direction thereof coincides with the scanning direction of the annealing laser simplifies decreasing of the possibility of the entire channel region of the element driving transistor TFT2 being annealed by a single laser shot such that characteristics of that particular transistor TFT2 will not significantly differ from the transistors TFT2 for pixels at other locations.

In a display device such as that of the second embodiment, each of red, green, and blue pixels are often designed as a rectangle having a shorter side in the row direction and a longer side in the column direction, as illustrated in FIG. 6. In such a case, a required channel length can easily be acquired by arranging the channel length of the transistor TFT2 along the column direction, i.e. the longitudinal direction of the pixel region. In addition, such a layout enables to easily provide the channel length CL exceeding the laser movement pitch P.

The laser movement pitch P can be adjusted by setting of the optical system or the like. In this example the pitch is preferably set to deal with the channel length greater than the channel width, i.e. the pitch P is set smaller than the channel length CL.

In the second embodiment, the channel length CL of the channel region 12c in the transistor TFT2 is preferably set to exceed the movement pitch P between shots of the pulsed laser, as described above. Such setting ensures that the channel region 12c of the transistor TFT2 is polycrystallized through a plurality of pulsed laser shots, thereby reducing the difference in characteristics among the transistors TFT2 for pixels at different locations similarly polycrystallized through a plurality of pulsed laser shots.

Figure 7:
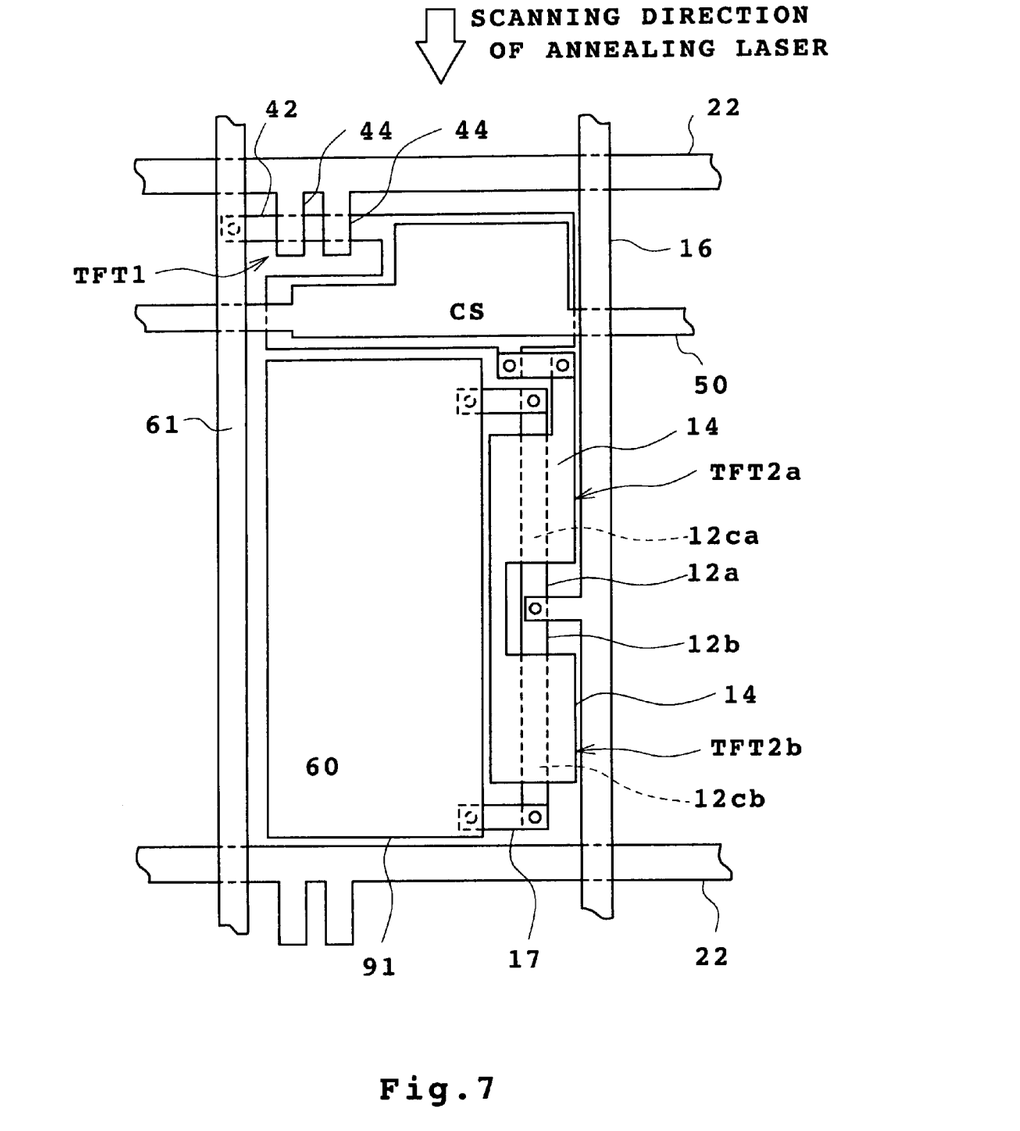
FIG. 7 illustrates another planar configuration of the organic EL display device according to the second embodiment of the present invention.

While a single transistor TFT2 with its channel direction arranged as set forth above is provided between the corresponding organic EL element 60 (the anode 91 thereof) and the power source line 16 in the above-described layout of FIG. 6, a plurality of transistors TFT2 may be provided as in the first embodiment. FIG. 7 shows an exemplary layout in which a plurality of element driving transistors TFT2 are connected in parallel between the power source line 16 and the organic EL element 60. The equivalent circuit of the pixel configuration illustrated in FIG. 7 is the same as that shown in FIG. 1.

Active layers 12a and 12b of the element driving transistors TFT2a and TFT2b shown in FIG. 7 also extend in the direction parallel to the scanning direction of the annealing laser (same as the direction in which the data line 61 extends in this example). The active layers 12a and 12b illustrated in FIG. 7 are aligned in a straight line. While the active layers of the plurality of transistors TFT2a and TFT2b need not be aligned in a straight line, channel regions 12ca and 12cb of the transistors TFT2a and TFT2b, respectively, are preferably arranged so as not to run in completely the same manner with respect to the laser scanning direction but to deviate from each other at least slightly. Such a deviation can significantly reduce the likelihood of resulting problems, such as the characteristics of both transistors TFT2a and TFT2b deviating from the designed values in completely the same manner, and both transistors simultaneously becoming inoperable, whereby variation in total amount of current supplied to the organic EL element 60 for each pixel can be decreased.

Further, in the configuration of FIG. 7, the distance L between the channels 12ca and 12cb of the thin film transistors TFT2a and TFT2b is preferably longer than the laser movement pitch P. A layout satisfying such a condition ensures prevention of simultaneous malfunction of the plurality of transistors TFT2a and TFT2b in a single pixel which would otherwise be possibly caused by laser annealing.

With the embodiments described above, the entire channel region of a single element driving thin film transistor for supplying a current to the organic EL element can be prevented from being annealed with a single shot by arranging the element driving thin film transistor such that the channel length direction thereof runs substantially parallel to the laser scanning direction or that the longitudinal direction of the laser irradiation area traverses the channel in the channel width direction. Such an arrangement averages variation, if generated, in irradiation energy among laser annealing shots, thereby preventing a significant difference in characteristics among the element driving thin film transistors for pixels at different locations.

Further, displacing the plurality of thin film transistors for supplying a current to the corresponding organic EL element from each other with respect to the laser scanning direction can prevent the plurality of thin film transistors from varying in the same manner.

Further, by separating the channels of the plurality of thin film transistors by the distance longer than the laser movement pitch, the likelihood of annealing the two thin film transistors through a particular laser shot can be decreased, thereby significantly reducing the chance of malfunctions, such as the same variation in the two thin film transistors.

What is claimed is:

1. A semiconductor device having on a substrate a plurality of thin film transistors using a semiconductor layer annealed with a line pulsed laser as a channel region, comprising:
   at least one element driving thin film transistor for supplying a driving current from a power source line to a corresponding driven element; and
   a switching thin film transistor for controlling said element driving thin film transistor based on a data signal supplied when selected; wherein
   said element driving thin film transistor is disposed such that a longitudinal direction of an area irradiated with said line pulsed laser traverses said element driving thin film transistor in a channel width direction thereof.

2. The semiconductor device according to claim 1, wherein
   a channel length of said element driving thin film transistor is longer than a pitch of a single movement of said pulsed laser.

3. The semiconductor device according to claim 1, wherein
   a plurality of said element driving thin film transistors are provided between said power source line and said corresponding driven element.

4. The semiconductor device according to claim 3, wherein said plurality of element driving thin film transistors are disposed such that channel length directions of said transistors are displaced from each other in a scanning direction of said pulsed laser.

5. The semiconductor device according to claim 1, wherein
   a channel length direction of said element driving thin film transistor does not coincide with a channel length direction of said switching thin film transistor.

6. The semiconductor device according to claim 1, wherein
a channel length direction of said element driving thin film transistor coincides with a direction in which a data line for supplying said data signal to said switching thin film transistor extends.

7. A semiconductor device having on a substrate a plurality of thin film transistors using a semiconductor layer annealed with a pulsed laser as a channel region, comprising:
at least one element driving thin film transistor for supplying a driving current from a power source line to a corresponding driven element; and
a switching thin film transistor for controlling said element driving thin film transistor based on a data signal supplied when selected; wherein
said element driving thin film transistor is disposed such that a channel length direction thereof runs substantially parallel to a scanning direction of said pulsed laser.

8. The semiconductor device according to claim 7, wherein
a channel length of said element driving thin film transistor is longer than a pitch of a single movement of said pulsed laser.

9. The semiconductor device according to claim 7, wherein
a plurality of said element driving thin film transistors are provided between said power source line and said corresponding driven element.

10. The semiconductor device according to claim 9, wherein
said plurality of element driving thin film transistors are disposed such that channel length directions of said transistors are displaced from each other in a scanning direction of said pulsed laser.

11. The semiconductor device according to claim 7, wherein
a channel length direction of said element driving thin film transistor does not coincide with a channel length direction of said switching thin film transistor.

12. The semiconductor device according to claim 7, wherein
a channel length direction of said element driving thin film transistor coincides with a direction in which a data line for supplying said data signal to said switching thin film transistor extends.

* * * * *

UNITED STATES PATENT AND TRADEMARK OFFICE
CERTIFICATE OF CORRECTION

PATENT NO.     : 6,548,867 B2
DATED          : April 15, 2003
INVENTOR(S)    : Yamada et al.

It is certified that error appears in the above-identified patent and that said Letters Patent is hereby corrected as shown below:

Title page,
Item [30], Foreign Application Priority Data, delete "Sep. 20, 2000" and insert therefor -- Sept. 29, 2000 --

Signed and Sealed this

Thirteenth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO.  : 6,548,867 B2
DATED       : April 15, 2003
INVENTOR(S) : Yamada et al.

It is certified that error appears in the above-identified patent and that said Letters Patent is hereby corrected as shown below:

Title page,
Item [30], Foreign Application Priority Data, delete "Sep. 20, 2000" and insert therefor -- Sept. 29, 2000 --

Signed and Sealed this

Third Day of August, 2004

JON W. DUDAS
*Acting Director of the United States Patent and Trademark Office*